United States Patent [19]
Lane

[11] Patent Number: 5,136,263
[45] Date of Patent: Aug. 4, 1992

[54] HARMONIC OSCILLATOR

[75] Inventor: David J. Lane, Beverly, Mass.

[73] Assignee: AT&T Bell Laboratories, Murray Hill, N.J.

[21] Appl. No.: 718,519

[22] Filed: Jun. 24, 1991

[51] Int. Cl.$^5$ .......................... H03B 5/00; H03B 5/36
[52] U.S. Cl. .................................. 331/158; 331/116 R
[58] Field of Search .......... 331/116 R, 116 FE, 16 M, 331/117 R, 117 FE, 117 D, 154, 158, 159

[56] References Cited
U.S. PATENT DOCUMENTS 4,571,558  2/1986  Gay et al. .................... 331/158 X
4,862,114  8/1989  Kleinberg .................... 331/116 R X Primary Examiner—David Mis
Attorney, Agent, or Firm—Eli Weiss

[57] ABSTRACT

This invention relates to an oscillator for overtone operations which has reduced parts count and improved performance. More specifically, a new improved Pierce type of harmonic oscillator is disclosed which eliminates the need for additional bias circuit components; which does not use an LC tank circuit and which has substantially increased gain. More specifically, the new harmonic oscillator is self biased, the input impedance is an RC circuit, an LC circuit, or a resistor. The component value of the input impedance can be chosen to selectively roll off low frequency feedback gain to produce oscillation at a desired overtone of a resonator. With a differential amplifier, the resonator can be driven with both outputs of the oscillator amplifier to effectively double the available gain and eliminate the need for an additional stage of amplification.

8 Claims, 3 Drawing Sheets

HARMONIC OSCILLATOR

TECHNICAL FIELD

This invention relates generally to oscillators and more particularly to a harmonic oscillator having improved operating characteristics and reduced parts counts and manufacturing costs.

BACKGROUND OF THE INVENTION

An oscillator is a circuit which originally used electron tubes but now normally uses individual transistors or gates to generate an AC output signal. The frequency of the signal generated may be quite low for audio oscillators or quite high for rf, microwave oscillators and the like. There are many applications for oscillators such as signal generators, frequency standards, transmitters, receivers and the like.

Although oscillators perform definite functions in various circuits, in all instances they are considered to be devices which are used for the purpose of generating signals having specific frequencies.

Currently there are numerous designs for oscillator circuits which use semiconductor devices, one of which is the Pierce oscillator. The pierce oscillator can be built using CMOS, TTL or ECL gates both as an amplifier and to provide the appropriate output signal. CMOS is normally used for low frequencies, TTL is normally used for medium frequencies, and ECL in used for both medium and high frequencies. Frequently, to obtain relatively high frequency signals, a Pierce oscillator will be operated as a harmonic oscillator.

The Pierce oscillator circuit provides outstanding operating characteristics. For example, the waveform and stability are good, variations of power supply or temperature have little effect on the frequency of the signal obtained, and it provides a relatively high output potential. A manor disadvantage of the Pierce circuit is that it requires a relatively large number of components.

A new improved oscillator is required which satisfies the constraints of integrated circuits size and parts count limitations required to satisfy not only the space and cost limitations of todays integrated circuit manufacturing technologies, but also has the outstanding performance characteristics of a Pierce type of oscillator.

SUMMARY OF THE INVENTION

This invention relates to an oscillator for overtone operations which has reduced parts count and improved performance. More specifically, a new improved Pierce type of harmonic oscillator is disclosed which eliminates the need for additional bias circuit components; which does not use an LC tank circuit and which has substantially increased gain. More specifically, the new harmonic oscillator is self biased, the input impedance is an RC circuit, an LC circuit, or a resistor. The component value of the input impedance can be chosen to selectively roll off low frequency feedback gain to produce oscillation at a desired overtone of a resonator. With a differential amplifier, the resonator can be driven with both outputs of the oscillator amplifier to effectively double the available gain and eliminate the need for an additional stage of amplification.

DETAILED DESCRIPTION

An oscillator circuit generates an AC output signal, usually at a definite frequency and with a specified waveform. Although oscillators perform definite functions in different circuits, for example, timing circuits, transmitter circuits and the like, in all instances they are considered to be circuits which are used to generate a signal having a specific frequency. The frequency generated by a harmonic oscillator is primarily determined by a resonant circuit which can consist of an inductance-capacitance (LC) network, a resistance-capacitance (RC) network, or a crystal resonator.

An oscillator is an amplifier with a portion of its output signal ed back to the input with proper phase to start and sustain oscillation. A DC bias voltage or current is required to bias the oscillator input such that the circuit can amplify the signal at is input. By applying a portion of the amplified output signal back to the input as regenerative feedback, the input circuit losses are overcome and the circuit may oscillate. An important consideration is that the feedback signal is applied with a specific phase to the input.

The frequency-determining elements of a harmonic oscillator may be an inductance-capacitance circuit, a resistance-capacitance circuit, a crystal resonator or some additional network.

As noted above, the Pierce oscillator has many desirable operating characteristic. For a complete understanding of oscillators, particularly the Pierce type oscillator which may operate at a resonator's fundamental or overtone frequency, reference is made to the text "Crystal Oscillator Circuits" by Robert J. Matthys, published by John Wiley & Sons.

This invention is based upon a Pierce type of gate oscillator topology. The Pierce oscillator was chosen because it has good operating characteristics when used for overtone applications. In this invention, there is disclosed a modified Pierce type of oscillator which results in a new topology which both reduces the parts count and improved performance. In addition, structure in accordance with the principles of this invention can be applied to similar oscillator topologies including a series oscillator described below.

Figure 1:
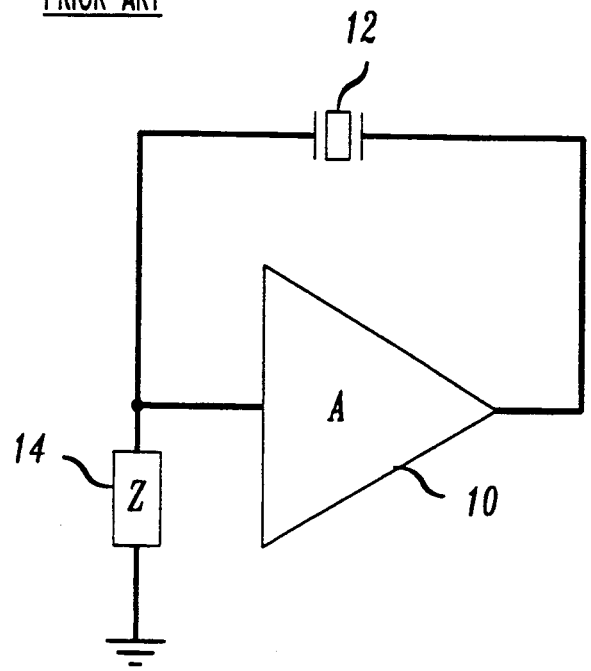
FIG. 1 is a block diagram of a prior art feedback oscillator with a resonator in the feedback loop.

Referring to FIG. 1, there is illustrated a basic feedback oscillator having a resonator in the feedback loop. The circuit comprises an amplifier 10, a crystal resonator 12 and an input impedance 14. For a given topology the amplifier may require a limited high frequency bandwidth. This high frequency gain roll off may be inherent in the particular amplifier or be implemented with additional filtering components. When the input impedance is primarily resistive and the amplifier non-inverting the topology is often termed a series oscillator. When the input impedance is primarily capacitive and the amplifier inverting the topology is referred to as a Pierce oscillator.

Figure 2:
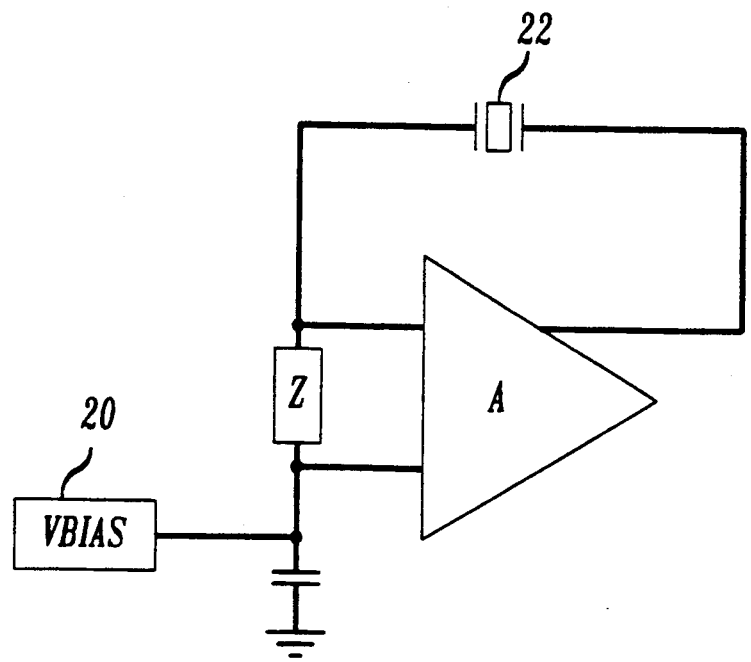
FIG. 2 is a block diagram of the prior art feedback oscillator with a resonator in the feedback loop of an amplifier having a differential input.

Referring to FIG. 2, there is illustrated the topology of the circuit of FIG. 1 applied to an amplifier having a input. This circuit is useful in applications where differential outputs are required. In FIG. 2, a crystal resonator 12 is located in a feedback loop of a differential amplifier 11 having an input impedance 15, a bias source 20 and a blocking capacitor 19.

Solid state silicon chip circuits of various topologies are commercially available. One such silicon chip is manufactured by Motorola and is identified MC10E116. The MC10E116 silicon chip contains three differential amplifiers designed for use in sensing differential signals.

The circuit of FIG. 2 has two drawbacks. One is that an additional bias network 20 is required to set the bias at one input. The second is that the resonator 22 requires both an output and an input. This requires an additional integrated circuit (IC) pad and complicates the circuit for Voltage Controlled Crystal Oscillator (VCXO) applications.

Due to processing limitations during manufacture, the maximum resonant frequency of most quartz crystals is approximately 50 MHz. For frequencies above 50 MHz, crystals are used which will oscillate at a harmonic, or "overtone" of then fundamental frequency. When the desired oscillator frequency requires that an overcome crystal be used, additional precautions must be taken in the design of the circuit to insure that it will oscillate only at the desired frequency. This is because an overtone crystal will operate at harmonics other than the one intended, as well as the fundamental frequency.

Because we are interested in generating a signal having a frequency which is greater than 50 MHz, the oscillator here disclosed is a harmonic or overtone oscillator.

All oscillators which are based on discrete transistors or integrated circuit amplifiers require that the amplifier input be biased to place the amplifier in its linear gain range. As illustrated in FIG. 2, for a typical feedback oscillator configuration, this requires the development of additional bias voltages and additional bypass and feedback components to achieve the proper biasing.

Figure 3:
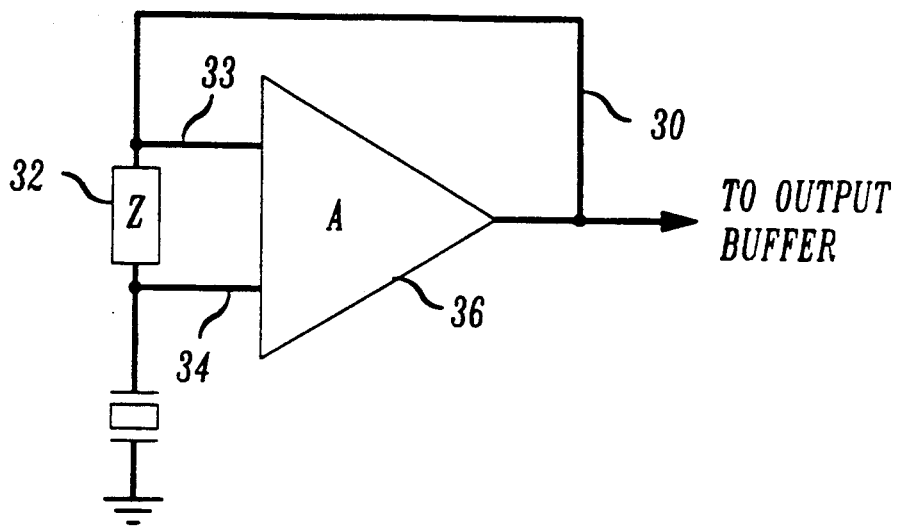
FIG. 3 is a block diagram of an embodiment of the invention illustrating a harmonic oscillator with self biased input.

Referring to FIG. 3, there is illustrated structure in accordance with the principles of the invention which requires no additional bias components. In the embodiment of FIG. 3, a direct connection 30 from the output of the amplifier to the input of the amplifier is used to bias the inputs. In this embodiment, the impedance 32 is designed to supply a low resistance DC path to the second input port 34 of the amplifier 36. This new arrangement can be used with series oscillators where the impedance 32 is a resistor and the amplifier 36 is noninverting, or when the oscillator is of a Pierce topology where the impedance 32 is either a parallel RC or LC circuit. When the arrangement disclosed is used with a series oscillator, the output to input connection is positive and the impedance 32 should be a relatively low impedance to ensure that both input ports 33, 34 receive substantially the same DC feedback signal.

To prevent oscillation at the fundamental crystal frequency, the prior art Pierce type of circuits typically require an LC tank circuit. Often, this is a parallel LC circuit at the input of the oscillator, but other locations can be used. In the embodiment here disclosed, a parallel RC circuit is used to roll off the feedback gain to the fundamental frequency. The parallel RC circuit becomes more resistive at low frequencies and, therefore, there is now reduced gain at those lower frequencies. While it is not required, the time constant of the parallel RC circuit can be chosen to be above the fundamental frequency of the crystal. It is both the combination of the output and input time constants, and the gain that results in the roll off.

Figure 4:
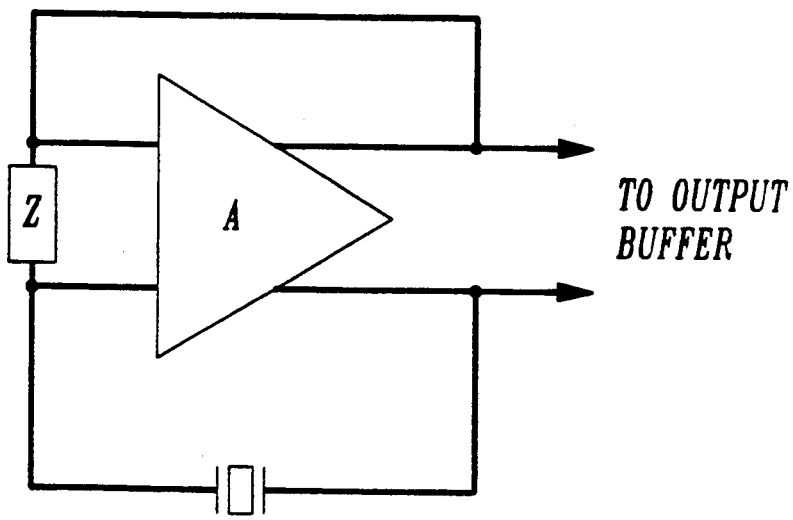
FIG. 4 is a block diagram of an embodiment of the invention illustrating a harmonic oscillator with self biased input and differential drive of the crystal.

Often, when using a Pierce type of oscillator circuit, a single Emitter Coupled Logic (ECL) amplifier cannot generate the gain required. In the embodiment illustrated in FIG. 4, the crystal can be connected back to the normally unused output of the differential amplifier. With this embodiment, the gain available from the single amplifier is effectively doubled. This embodiment also results in a differential output waveform which is more symmetrical, and provides a better duty cycle when amplified by an output buffer. The embodiment of FIG. 4 which illustrates the use of the differential drive can only be used in combination with the self-biased input.

Figure 5:
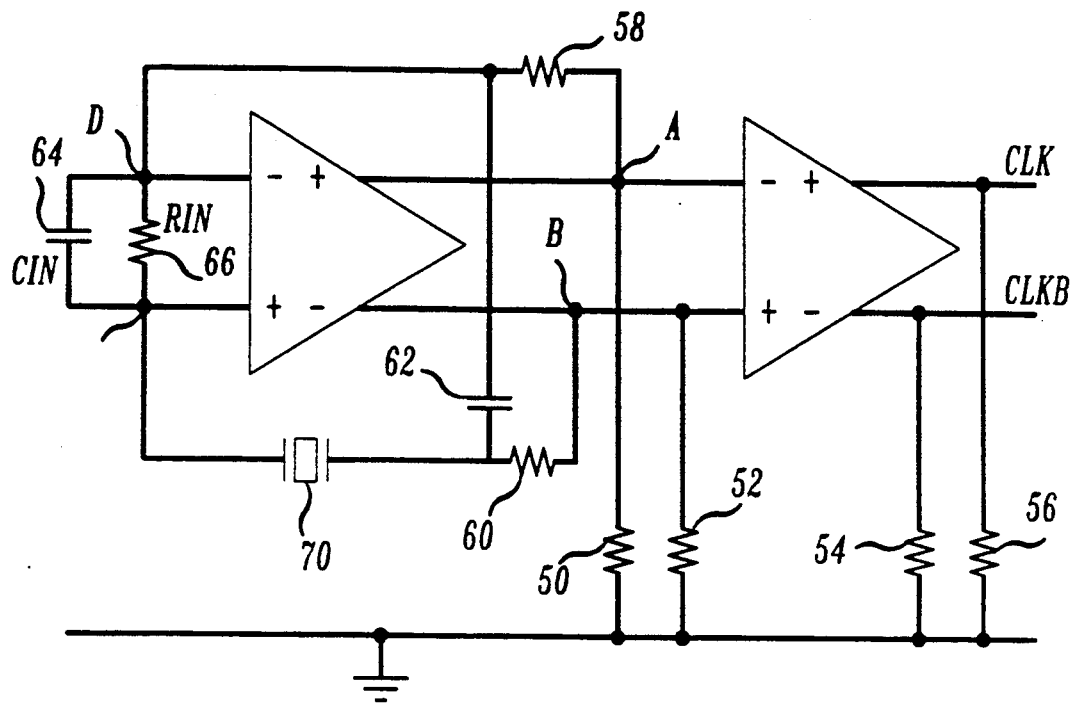
FIG. 5 is a partial block schematic illustrating a harmonic oscillator executed in ECL integrated circuit technology in accordance with the principles of the invention.
Figure 6:
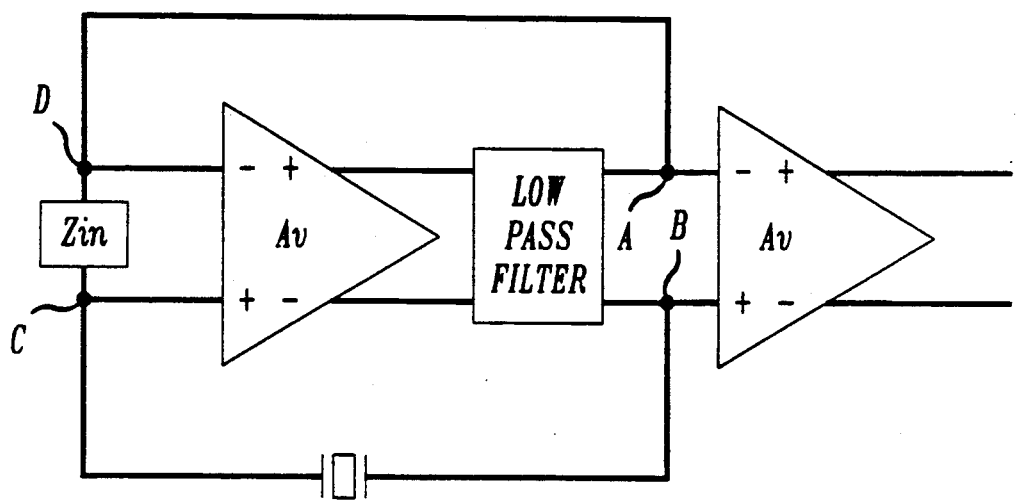
FIG. 6 is a block diagram of the embodiment of FIG. 5.

Referring to FIG. 5, there is illustrated a harmonic oscillator based upon the Pierce topology executed in ECL integrated circuit technology. FIG. 6 illustrates the block diagram of the structure of FIG. 5. Returning to FIG. 5, the amplifiers are Motorola MC10E116 and resistors 50, 52, 54 and 56 are 500 ohm pull down resistors as required with the ECL outputs. These values, however, may vary with frequency and specific requirements. Resistors 58, 60 and capacitor 62 form an output low pass filter which adds the phase shift required for the Pierce type of oscillator circuit. In some applications this output low pass filter may be included internally in the amplifier and, therefore, may not be required with slower ECL technologies. Capacitor 64 and resistor 66 form the input impedance that results in the low frequency roll off. In addition, resistor 66 is the bias path to node C. The connection of node A to node D, the amplifier output to the input results in the direct self bias. The connection of the crystal from node C to node B provides the differential drive connection. If desired, the crystal 70 can be connected from node C to ground. With this modification there will be a reduction in gain.

In one embodiment where the crystal is operated at its third harmonic to obtain a frequency of 95 MHz, the various components of FIG. 5 has values as follows:

| | |
|---|---|
| Resistors 50, 52, 54 and 56; | 500 ohms; |
| Resistors 58 and 60; | 25 ohms; |
| Resistor 66; | 250 ohms; |
| Capacitor 64; | 18 pF; and |
| Capacitor 62; | 39 pF. |

In the embodiment disclosed, modifications were made to a standard Pierce type of oscillator circuit to provide a new improved harmonic oscillator which has excellent operating characteristics and reduced parts count. The new improved circuit discloses a self biased input, the use of an RC input to roll off gain for overtone oscillation, and the coupling of the crystal to both output of a differential amplifier to provide differential drive.

The self biased input eliminates the need for any additional bias circuits components. The input LC tank circuit normally used with overtone oscillators is replaced with an RC circuit which effectively rolls off the feedback gain at the crystal's fundamental frequency to insure oscillation at the third harmonic. The use of both outputs of the differential oscillator amplifier to drive the crystal doubles the available gain and eliminates the need for additional amplification stages.

I claim:

1. A harmonic oscillator comprising
a differential amplifier having two input ports and two output ports,
coupling one of said output ports to one of said input ports to self bias the differential amplifier;
coupling a resonator between the other input port and the second output port of said differential amplifier;
an impedance coupled to provide a dc path between said first and second input ports, and
filter means coupled to provide a phase shift to the signal from the output port to the input port.

2. A harmonic oscillator of claim 1 wherein said impedance coupled to provide a dc path between said first and second input ports comprises a resistive circuit.

3. A harmonic oscillator of claim 1 wherein said impedance coupled to provide a dc path between said first and second input ports comprises an RC circuit.

4. A harmonic oscillator of claim 1 wherein said impedance coupled to provide a dc path between said first and second input ports comprises a LC circuit.

5. A harmonic oscillator of claim 1 wherein said impedance coupled to provide a dc path between said first and second input ports comprises an inductor.

6. A harmonic oscillator of claim 2 wherein said resistive circuit is an RC network to roll off feedback gain at the fundamental frequency of the resonator to provide oscillation at the 3rd harmonic of the resonator.

7. A harmonic oscillator of claim 1 wherein said impedance is a low resistance path adapted to provide substantially similar DC feedback signals to each of said two input ports.

8. A harmonic oscillator of claim 2 wherein said RC network is a parallel RC circuit.

* * * * *